(12) United States Patent
Hikichi

(10) Patent No.: US 10,641,841 B2
(45) Date of Patent: May 5, 2020

(54) MAGNETIC SENSOR CIRCUIT, TEST METHOD FOR THE SAME, AND MANUFACTURING METHOD FOR A SEMICONDUCTOR DEVICE HAVING A MAGNETIC SENSOR CIRCUIT

(71) Applicant: ABLIC Inc., Chiba-shi, Chiba (JP)

(72) Inventor: Tomoki Hikichi, Chiba (JP)

(73) Assignee: ABLIC INC., Chiba (JP)

( * ) Notice: Subject to any disclaimer, the term of this patent is extended or adjusted under 35 U.S.C. 154(b) by 58 days.

(21) Appl. No.: 15/918,481

(22) Filed: Mar. 12, 2018

(65) Prior Publication Data

US 2018/0267112 A1    Sep. 20, 2018

(30) Foreign Application Priority Data

Mar. 14, 2017  (JP) .................................. 2017-048804

(51) Int. Cl.
*G01R 33/00* (2006.01)
*G01R 33/02* (2006.01)
(Continued)

(52) U.S. Cl.
CPC ......... *G01R 33/0023* (2013.01); *G01D 5/145* (2013.01); *G01D 18/00* (2013.01); *G01R 33/0035* (2013.01); *G01R 33/02* (2013.01)

(58) Field of Classification Search
CPC ........ G01R 33/23; G01R 33/02; G01R 33/35; G01D 5/145
See application file for complete search history.

(56) References Cited

U.S. PATENT DOCUMENTS 5,247,278 A     9/1993 Pant et al.
9,000,761 B2 *  4/2015 Tay .................. G01R 33/072
                                                 324/251
(Continued)

FOREIGN PATENT DOCUMENTS

JP      2014-006087 A    1/2014

OTHER PUBLICATIONS

Stoica, D. et al., "A Dual Vertical Hall Latch with Direction Detection", *IEEE*, 2013, pp. 213-216.
(Continued)

*Primary Examiner* — Tung X Nguyen
*Assistant Examiner* — Dominic E Hawkins
(74) *Attorney, Agent, or Firm* — Brinks Gilson & Lione

(57) ABSTRACT

A magnetic sensor circuit includes: one of a first magnetic sensor element configured to output a voltage in accordance with a vertical magnetic field and a second magnetic sensor element configured to output a voltage in accordance with a horizontal magnetic field; a magnetic field signal processing circuit configured to output a signal in accordance with the voltage; at least three terminals capable of being connected to an external element, the at least three terminals being a first, a second, and a third terminal; a first wiring connecting the first terminal and the second terminal; and a second wiring connecting the first terminal and the third terminal in which one of the first magnetic sensor element and the second magnetic sensor element is arranged at a position where detection of a magnetic field generated by one of the first wiring and the second wiring is capable.

7 Claims, 4 Drawing Sheets

(51) Int. Cl.
G01D 5/14 (2006.01)
G01D 18/00 (2006.01)

(56) References Cited

U.S. PATENT DOCUMENTS

| | | | |
|---|---|---|---|
| 9,869,729 B1* | 1/2018 | Ausserlechner ... | G01R 33/0094 |
| 9,945,912 B2* | 4/2018 | Hioka ............... | G01R 33/0017 |
| 2007/0200564 A1* | 8/2007 | Motz .................. | G01R 33/09 |
| | | | 324/247 |
| 2008/0143329 A1* | 6/2008 | Ishihara ............ | G01R 15/207 |
| | | | 324/251 |
| 2008/0150522 A1* | 6/2008 | Hikichi ............. | G01R 33/07 |
| | | | 324/251 |
| 2011/0234215 A1* | 9/2011 | Ausserlechner ..... | G01R 15/20 |
| | | | 324/244 |
| 2012/0250404 A1* | 10/2012 | Wang ................ | G11C 11/161 |
| | | | 365/171 |
| 2013/0063135 A1* | 3/2013 | Suzuki .............. | G01R 33/098 |
| | | | 324/207.14 |
| 2015/0354999 A1* | 12/2015 | Ausserlechner ..... | G01D 11/305 |
| | | | 73/866.5 |

OTHER PUBLICATIONS

Extended European Search Report for European Application No. 18161529.5, dated Aug. 3, 20184, pp. 1-9.

* cited by examiner

MAGNETIC SENSOR CIRCUIT, TEST METHOD FOR THE SAME, AND MANUFACTURING METHOD FOR A SEMICONDUCTOR DEVICE HAVING A MAGNETIC SENSOR CIRCUIT

RELATED APPLICATIONS

This application claims priority under 35 U.S.C. § 119 to Japanese Patent Application No. 2017-048804 filed on Mar. 14, 2017, the entire content of which is hereby incorporated by reference.

BACKGROUND OF THE INVENTION

1. Field of the Invention

The present invention relates to a magnetic sensor circuit, a test method for the magnetic sensor circuit, and a manufacturing method for a semiconductor device having a magnetic sensor circuit.

2. Description of the Related Art

In recent years, there has been known a biaxial magnetic circuit configured to detect a vertical alternating magnetic field and a horizontal alternating magnetic field in order to detect the number of rotations and a rotational direction of various rotary mechanisms. The biaxial magnetic circuit has an advantage of a higher degree of freedom of design of magnetic mechanisms as compared to a related-art magnetic sensor configured to detect only a vertical magnetic field. Meanwhile, in a mass-production test phase, a vertical magnetic field and a horizontal magnetic field should be applied to the biaxial magnetic circuit for testing.

In order to enhance mass productivity, it is desired to perform a magnetic field application test in a wafer test for a pass/fail selection of the sensor before package assembly. However, in the magnetic field application test, use of both a horizontal magnetic field application mechanism configured to apply a horizontal magnetic field to the wafer and a vertical magnetic field application mechanism configured to apply a vertical magnetic field to the wafer, and also adjustment of a position at which the magnetic fields are applied with high accuracy are required.

In this case, there is known a technology of performing the magnetic field application test for a horizontal magnetic field sensor element by providing a dedicated structure in a circuit and applying a test current from the outside to generate a horizontal magnetic field (see, for example, FIG. 8 and related explanations in "A Dual Vertical Hall Latch with Direction Detection", Proceedings of the ESSCIRC 2013).

However, in the related art, there has been a case in which an occupied area of the circuit increases due to the structure dedicated to the magnetic field application test for the horizontal magnetic field sensor element.

SUMMARY OF THE INVENTION

It is an object of the present invention to provide a magnetic sensor circuit capable of performing a magnetic field application test for a sensor element while an occupied area of the circuit is reduced.

According to one embodiment of the present invention, there is provided a magnetic sensor circuit including: one of a first magnetic sensor element configured to output a voltage in accordance with a vertical magnetic field and a second magnetic sensor element configured to output a voltage in accordance with a horizontal magnetic field; a magnetic field signal processing circuit configured to output a signal in accordance with the voltage; at least three terminals capable of being connected to an external element, the at least three terminals being a first terminal, a second terminal, and a third terminal; a first wiring connecting the first terminal and the second terminal; and a second wiring connecting the first terminal and the third terminal, in which one of the first magnetic sensor element and the second magnetic sensor element is arranged at a position where detection of a magnetic field generated by one of the first wiring and the second wiring is capable.

According to one embodiment of the present invention, there is provided a test method of performing, for the above-mentioned magnetic sensor circuit, a magnetic field application test for one of the first magnetic sensor element and the second magnetic sensor element by applying a current which is larger than a current that flows through the magnetic sensor circuit under normal operation through one of the first wiring and the second wiring.

According to one embodiment of the present invention, there is provided a method of manufacturing a semiconductor device which includes the above-mentioned test method.

According to one embodiment of the present invention, there is provided a magnetic sensor circuit including: a magnetic sensor element configured to output a voltage in accordance with a magnetic field; a magnetic field signal processing circuit configured to output a signal in accordance with the voltage; at least two terminals capable of being connected to an external element, the at least two terminals being a first terminal and a second terminal; and a wiring connecting the first terminal and the second terminal, and through which a current larger than a current that flows through the magnetic sensor circuit under normal operation is applied, in which the magnetic sensor element is arranged at a position where detection of a magnetic field generated by the wiring is capable.

According to the present invention, it is possible to provide a magnetic sensor circuit capable of performing the magnetic field application test for the sensor element while the occupied area of the circuit is reduced.

DETAILED DESCRIPTION OF THE EMBODIMENTS

First Embodiment

Now, a first embodiment of the present invention is described with reference to the drawings.

Arrangement in Magnetic Sensor Circuit

Figure 1:
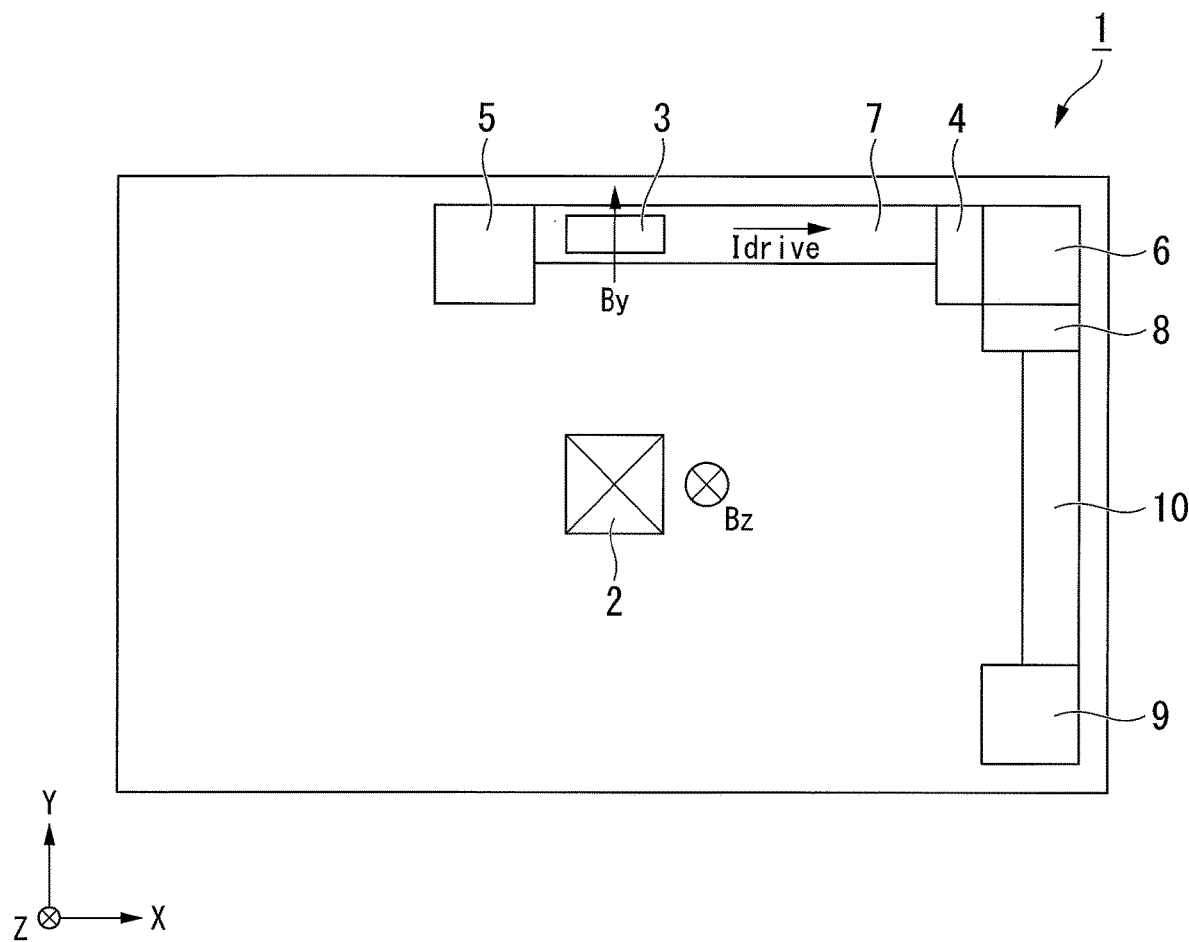
FIG. 1 is a diagram for illustrating an example of an arrangement in a magnetic sensor circuit according to a first embodiment of the present invention.

FIG. 1 is a diagram for illustrating an example of an arrangement in a magnetic sensor circuit 1 according to the first embodiment.

As illustrated in FIG. 1, the magnetic sensor circuit 1 includes a vertical magnetic field sensor 2, a horizontal magnetic field sensor 3, a first drive circuit 4, a second external terminal 5, a first external terminal 6, a first wiring 7, a second drive circuit 8, a third external terminal 9, a second wiring 10, a vertical signal processing circuit 101 (not shown), and a horizontal signal processing circuit 102 (not shown).

The vertical magnetic field sensor 2 is configured to detect a magnetic field in a vertical direction that is generated in the magnetic sensor circuit 1. Further, the vertical magnetic field sensor 2 is also configured to output a voltage in accordance with a direction and a magnitude of the detected magnetic field. The horizontal magnetic field sensor 3 is configured to detect a magnetic field in a horizontal direction that is generated in the magnetic sensor circuit 1. Further, the horizontal magnetic field sensor 3 is also configured to output a voltage in accordance with a direction and a magnitude of the detected magnetic field.

In the following description, when the direction of the magnetic field is described, an XYZ orthogonal coordinate system may be used in some cases. In this XYZ orthogonal coordinate system, a Y axis represents a longitudinal direction of a plane on which the vertical magnetic field sensor 2 and the horizontal magnetic field sensor 3 are arranged, that is, a horizontal direction of the plane, an X axis represents a lateral direction of the plane on which the vertical magnetic field sensor 2 and the horizontal magnetic field sensor 3 are arranged, and a Z axis represents a height direction of the plane on which the vertical magnetic field sensor 2 and the horizontal magnetic field sensor 3 are arranged, that is, a vertical direction of the plane.

The second external terminal 5 and the first external terminal 6 are connected to each other via the first drive circuit 4 by the first wiring 7. Further, the third external terminal 9 and the first external terminal 6 are connected to each other via the second drive circuit 8 by the second wiring 10. The first drive circuit 4 and the second drive circuit 8 are, for example, metal-oxide-semiconductor field-effect transistors (MOSFETs). When a gate terminal of the first drive circuit 4 is applied with a voltage by the vertical signal processing circuit 101, the first drive circuit 4 is controlled so as to be in an ON state, and thus a drive current can flow to the second external terminal 5 and the first external terminal 6. Further, when a gate terminal of the second drive circuit 8 is applied with a voltage by the horizontal signal processing circuit 102, the second drive circuit 8 is controlled so as to be in an ON state, and thus a drive current can flow to the third external terminal 9 and the first external terminal 6.

The vertical signal processing circuit 101 is configured to control a state of the first drive circuit 4 in accordance with a signal output from the vertical magnetic field sensor 2 as a result of detection of a vertical magnetic field. Specifically, when the vertical magnetic field detected by the vertical magnetic field sensor 2 is a magnetic field that is in a positive direction of the Z axis and has a predetermined intensity or more, the vertical signal processing circuit 101 controls the first drive circuit 4 to the ON state. Further, when the vertical magnetic field detected by the vertical magnetic field sensor 2 is a magnetic field that is in a negative direction of the Z axis and has a predetermined intensity or more, the vertical signal processing circuit 101 controls the first drive circuit 4 to an OFF state.

The horizontal signal processing circuit 102 is configured to control a state of the second drive circuit 8 in accordance with a signal output from the horizontal magnetic field sensor 3 as a result of detection of a horizontal magnetic field. Specifically, when the horizontal magnetic field detected by the horizontal magnetic field sensor 3 is a magnetic field that is in a positive direction of the Y axis and has a predetermined intensity or more, the horizontal signal processing circuit 102 controls the second drive circuit 8 to the ON state. Further, when the horizontal magnetic field detected by the horizontal magnetic field sensor 3 is a magnetic field that is in a negative direction of the Y axis and has a predetermined intensity or more, the horizontal signal processing circuit 102 controls the second drive circuit 8 to an OFF state.

In the example of the first embodiment, a vertical magnetic field is applied to the magnetic sensor circuit 1 by a vertical magnetic field application mechanism configured to apply a vertical magnetic field. The vertical magnetic field sensor 2 detects the vertical magnetic field applied by the vertical magnetic field application mechanism.

The horizontal magnetic field sensor 3 is arranged at a position at which the horizontal magnetic field sensor 3 can detect a magnetic field generated from the first wiring 7. A magnetic field application test for the horizontal magnetic field sensor 3 is performed with use of the magnetic field generated from the first wiring 7. The position at which the horizontal magnetic field sensor 3 can detect the magnetic field generated from the first wiring 7 is, for example, below the first wiring 7. As illustrated in FIG. 1, in the example of the first embodiment, the horizontal magnetic field sensor 3 is arranged below the first wiring 7. As a result, the horizontal magnetic field sensor 3 detects a magnetic field in the horizontal direction (Y axis direction), which is a magnetic field in accordance with a drive current that flows through the first wiring 7. The current that flows through the first wiring 7 when the magnetic field application test for the horizontal magnetic field sensor 3 is performed with use of the magnetic field generated from the first wiring 7 is a current larger than a current that flows through the first wiring 7 when the magnetic sensor circuit 1 normally operates.

The horizontal magnetic field sensor 3 may be arranged above the first wiring 7 instead of below the first wiring 7.

Configuration of Magnetic Sensor Circuit

Now, detailed configuration of the magnetic sensor circuit 1 are described with reference to FIG. 2.

Figure 2:
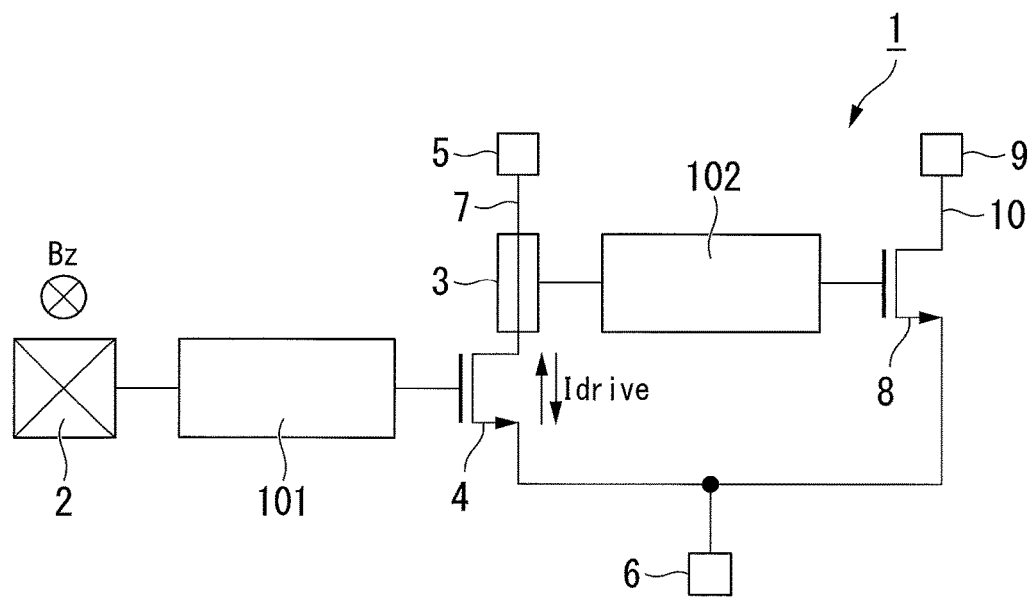
FIG. 2 is a diagram for illustrating an example of the magnetic sensor circuit according to the first embodiment.

FIG. 2 is a diagram for illustrating an example of the magnetic sensor circuit 1 according to the first embodiment.

In the example of the first embodiment, an external apparatus is connected between the second external terminal 5 and the first external terminal 6. The external apparatus is an apparatus capable of changing a magnitude and a direction of the drive current that flows between the second external terminal 5 and the first external terminal 6.

As described above, a vertical magnetic field is applied to the magnetic sensor circuit 1 by the vertical magnetic field application mechanism. Accordingly, the vertical magnetic field sensor 2 detects the vertical magnetic field. The vertical signal processing circuit 101 controls the first drive circuit 4 to the ON state in accordance with the detection of the vertical magnetic field by the vertical magnetic field sensor 2. As a result, the drive current flows between the second external terminal 5 and the first external terminal 6.

The horizontal magnetic field sensor 3 detects the horizontal magnetic field in accordance with the drive current that flows through the first wiring 7. For example, when the drive current flows in a direction from the first external terminal 6 to the second external terminal 5, the horizontal magnetic field sensor 3 detects a magnetic field in the positive direction of the Y axis. For example, when the drive current flows in a direction from the second external terminal 5 to the first external terminal 6, the horizontal magnetic field sensor 3 detects a magnetic field in the negative direction of the Y axis.

The horizontal signal processing circuit 102 controls the second drive circuit 8 to the ON state or the OFF state in accordance with the detection of the magnetic field by the horizontal magnetic field sensor 3.

Further, in the example of the first embodiment, the third external terminal 9 is applied with a voltage that is sufficiently higher than a potential of the first external terminal 6. The third external terminal 9 is applied with a voltage via, for example, a pull-up resistor. The third external terminal 9 holds a high potential (hereinafter referred to as "high level") when the second drive circuit 8 is in the OFF state, and changes the potential to the potential of the first external terminal 6 (hereinafter referred to as "low level") when the second drive circuit 8 is in the ON state.

The magnetic sensor circuit 1 according to the first embodiment performs the magnetic field application test for the horizontal magnetic field sensor 3 by checking the potential of the third external terminal 9.

Operation of Magnetic Sensor Circuit

Now, details of operation of the magnetic sensor circuit 1 are described with reference to FIG. 3.

Figure 3:
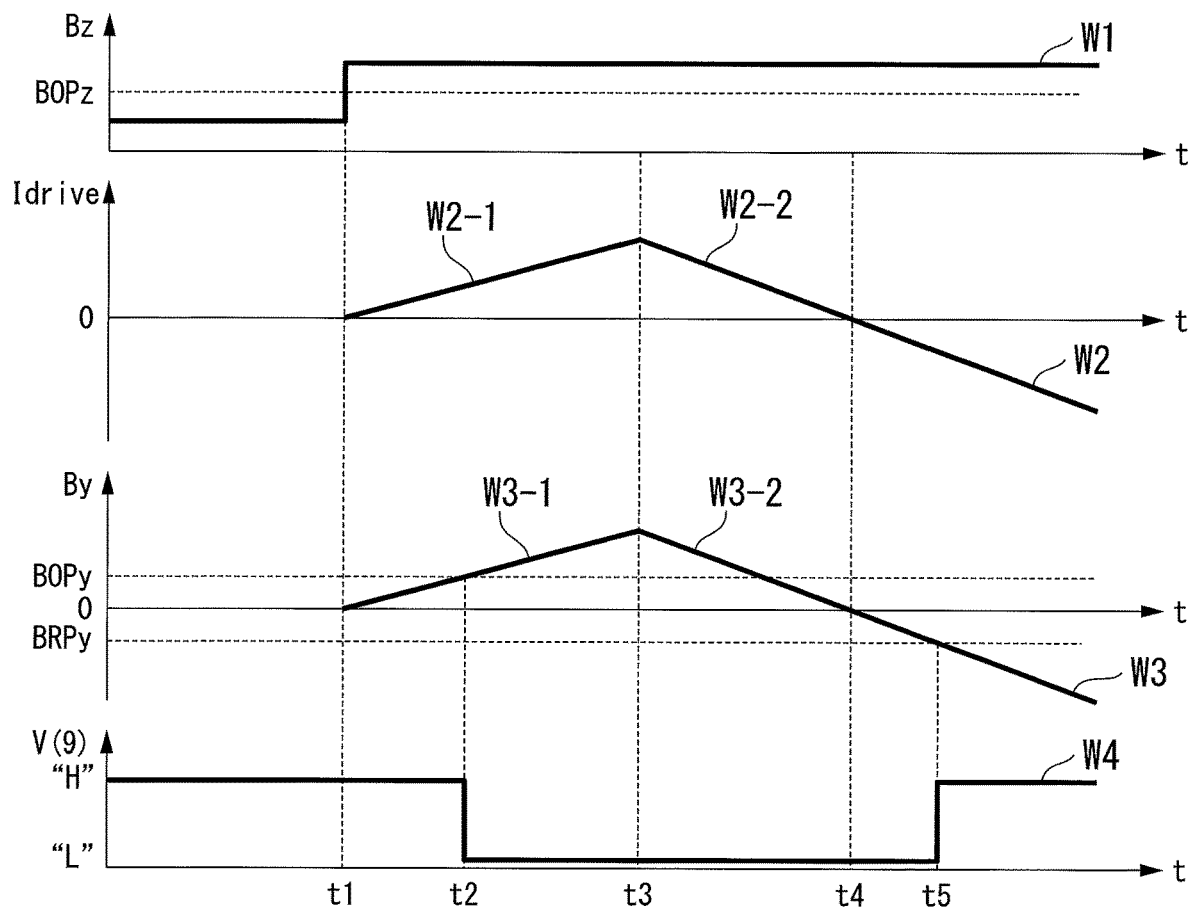
FIG. 3 is a timing chart for illustrating an example of operation of the magnetic sensor circuit according to the first embodiment.

FIG. 3 is a timing chart for illustrating an example of the operation of the magnetic sensor circuit 1 according to the first embodiment. In FIG. 3, a waveform W1 is a waveform for showing a temporal change of the vertical magnetic field applied to the magnetic sensor circuit 1 by the vertical magnetic field application mechanism. A waveform W2 is a waveform for showing a temporal change of the magnitude and the direction of the drive current that flows between the second external terminal 5 and the first external terminal 6 (that is, through the first wiring 7). This drive current is caused to flow between the second external terminal 5 and the first external terminal 6 by the external apparatus. The drive current that flows from the first external terminal 6 to the second external terminal 5 is shown by a waveform W2-1 having a positive inclination, and the drive current that flows from the second external terminal 5 to the first external terminal 6 is shown by a waveform W2-2 having a negative inclination. A waveform W3 is a waveform for showing the magnetic field in accordance with the drive current that flows through the first wiring 7, that is, the horizontal magnetic field detected by the horizontal magnetic field sensor 3. Specifically, the horizontal magnetic field in the positive direction of the Y axis is shown by a waveform W3-1 having a positive inclination, and the horizontal magnetic field in the negative direction of the Y axis is shown by a waveform W3-2 having a negative inclination. A waveform W4 is a waveform for showing a change of the potential of the third external terminal 9.

As illustrated in FIG. 3, the magnetic sensor circuit 1 is applied with the vertical magnetic field in the positive direction of the Z axis at a time t1 by the vertical magnetic field application mechanism. Further, at the time t1, in accordance with the detection of the applied vertical magnetic field by the vertical magnetic field sensor 2, the vertical signal processing circuit 101 controls the first drive circuit 4 to the ON state.

Next, during a period from the time t1 to a time t3, the external apparatus causes the drive current to flow in the direction from the first external terminal 6 to the second external terminal 5 while gradually increasing the magnitude of the drive current (shown waveform W2-1). Accordingly, the horizontal magnetic field sensor 3 detects the horizontal magnetic field that is the horizontal magnetic field in the positive direction of the Y axis and whose intensity is gradually increased from the time t1 to the time t3 (waveform W3-1: from time t1 to time t3).

Next, in the horizontal signal processing circuit 102, at the time t2, the intensity of the horizontal magnetic field detected by the horizontal magnetic field sensor 3 exceeds a predetermined intensity (shown threshold value BOPy) (waveform W3-1: time t2). The horizontal signal processing circuit 102 therefore controls the second drive circuit 8 to the ON state. Accordingly, the potential of the third external terminal 9 changes to the low level at the time t2 (waveform W4: time t2).

Next, from the time t3, the external apparatus causes the drive current to flow in the direction from the second external terminal 5 to the first external terminal 6. Further, from the time t3 to a time t4, the external apparatus gradually decreases the magnitude of the drive current (shown waveform W2-2). Accordingly, the horizontal magnetic field sensor 3 detects the horizontal magnetic field that is the horizontal magnetic field in the negative direction of the Y axis and whose intensity is gradually decreased from the time t3 to the time t4 (waveform W3-2: time t3 to time t4).

Next, from the time t4, the external apparatus gradually increases the magnitude of the absolute value of the drive current toward negative direction (waveform W2-2: from time t4). Accordingly, the horizontal magnetic field sensor 3 detects the horizontal magnetic field that is the horizontal magnetic field in the negative direction of the Y axis and whose intensity (absolute value) gradually increases from the time t4 (waveform W3-2: from time t4).

Next, in the horizontal signal processing circuit 102, at a time t5, the intensity (absolute value) of the horizontal magnetic field detected by the horizontal magnetic field sensor 3 becomes stronger than the predetermined intensity (shown threshold value BRPy) (waveform W3-2: time t5). The horizontal signal processing circuit 102 therefore controls the second drive circuit 8 to the OFF state. Accordingly, the potential of the third external terminal 9 changes to the high level at the time t5 (waveform W4: time t5).

Magnetic Conversion Characteristic of Magnetic Sensor Circuit

Figure 4:
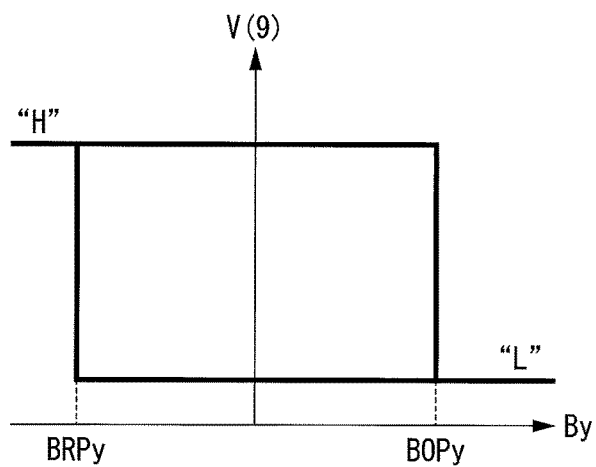
FIG. 4 is a graph for showing an example of a horizontal magnetic field conversion characteristic of the magnetic sensor circuit.

FIG. 4 is a graph for showing an example of a horizontal magnetic field conversion characteristic of the magnetic sensor circuit 1.

When the horizontal magnetic field detected by the horizontal magnetic field sensor 3 is the horizontal magnetic field in the positive direction of the Y axis, and its intensity exceeds the intensity of the threshold value BOPy, the potential of the third external terminal 9 (shown V(9)) changes from the high level to the low level. Further, when the horizontal magnetic field detected by the horizontal magnetic field sensor 3 is the horizontal magnetic field in the negative direction of the Y axis, and its intensity falls below the intensity of the threshold value BRPy, the potential of the third external terminal 9 changes to the high level.

As described above, the magnetic sensor circuit 1 performs an operation of detecting a magnetic field and converting the magnetic field into the potential of the third external terminal 9. With the configuration described above, the magnetic sensor circuit 1 performs, for example, alternation detection on a rotating magnetic body, for example, a ring-shaped multipolar magnet.

Summary of First Embodiment

As described above, the magnetic sensor circuit 1 according to the first embodiment includes the horizontal magnetic field sensor 3, the second external terminal 5, the first external terminal 6, the first wiring 7, the second drive circuit 8, the third external terminal 9, the second wiring 10, and the horizontal signal processing circuit 102. The horizontal magnetic field sensor 3 outputs a voltage in accordance with the horizontal magnetic field. The horizontal signal processing circuit 102 outputs a signal in accordance with the voltage output by the horizontal magnetic field sensor 3. The first wiring 7 connects between the first external terminal 6 and the second external terminal 5. The second wiring 10 connects between the first external terminal 6 and the third external terminal 9. The horizontal magnetic field sensor 3 is arranged at a position at which the horizontal magnetic field sensor 3 can detect a magnetic field generated from the first wiring 7.

With the magnetic sensor circuit 1 according to the first embodiment, the horizontal magnetic field sensor 3 can detect the horizontal magnetic field in accordance with the drive current that flows through the first wiring 7, and thus the magnetic field application test for the horizontal magnetic field sensor 3 can be performed. As a result, the magnetic sensor circuit 1 according to the first embodiment can perform the magnetic field application test for two axes with use of only one of two magnetic field application mechanisms (in this example, vertical magnetic field application mechanism).

Further, in the magnetic sensor circuit 1 according to the first embodiment, the first wiring 7 is a wiring through which the current to be detected by the horizontal magnetic field sensor 3 flows, and the horizontal magnetic field sensor 3 is arranged at a position at which the horizontal magnetic field sensor 3 can detect a magnetic field generated from the first wiring 7. As a result, the magnetic sensor circuit 1 according to the first embodiment can perform the magnetic field application test for the horizontal magnetic field sensor 3 while an occupied area of the circuit is reduced as compared to a case in which a wiring for operation confirmation is used.

Further, in the magnetic sensor circuit 1 according to the first embodiment, the magnetic field application test for the horizontal magnetic field sensor 3 is performed by causing a current larger than a current that flows through the magnetic sensor circuit 1 when the magnetic sensor circuit 1 normally operates to flow through the first wiring 7. In other words, the horizontal magnetic field to be detected by the horizontal magnetic field sensor 3 is a magnetic field stronger than the magnetic field generated due to the current that flows through the first wire 7. Consequently, with the magnetic sensor circuit 1 according to the first embodiment, the horizontal magnetic field sensor 3 can detect the horizontal magnetic field without being affected by the current that flows through the first wiring 7 when the magnetic sensor circuit 1 normally operates.

Further, in the magnetic sensor circuit 1 according to the first embodiment, the horizontal magnetic field sensor 3 is arranged below the first wiring 7. In this case, when a current flows through the first wiring 7, a magnetic field that has a circular shape having the first wiring 7 as a center is generated on a plane (in this example, YZ plane) perpendicular to a wiring direction of the first wiring 7 (in this example, X direction). In order to detect the magnetic field in the horizontal direction, it is preferred that the horizontal magnetic field sensor 3 be arranged at a position at which the horizontal magnetic field sensor 3 crosses a normal direction of the circle having the first wiring 7 as a center at right angles. In this case, the position on an XY plane where the horizontal magnetic field sensor 3 crosses the normal direction of the circle having the first wiring 7 as a center at right angles corresponds to the position below the first wiring 7 or above the first wiring 7. Consequently, when being arranged below the first wiring 7 or above the first wiring 7, the horizontal magnetic field sensor 3 can effectively detect a magnetic field generated from the first wiring 7 as a horizontal magnetic field.

Further, in the magnetic sensor circuit 1 according to the first embodiment, a current can flow through the first wiring 7 in both of the direction from the first external terminal 6 to the second external terminal 5 and the direction from the second external terminal 5 to the first external terminal 6. As a result, the magnetic sensor circuit 1 according to the first embodiment can detect two directions (positive direction and negative direction of Y axis) of the horizontal magnetic field detected by the horizontal magnetic field sensor 3.

Modification Example

In the above description, there has been described a case in which a vertical magnetic field is applied to the magnetic sensor circuit 1 by the vertical magnetic field application mechanism, and the magnetic field application test for the horizontal magnetic field sensor 3 is performed through the internal configuration of the magnetic sensor circuit 1.

In a modification example of the first embodiment, there is described a case in which a horizontal magnetic field is applied to the magnetic sensor circuit 1 by a horizontal magnetic field application mechanism, and a magnetic field application test for the vertical magnetic field sensor 2 is performed through the internal configuration of the magnetic sensor circuit 1.

The same configurations as those of the first embodiment are denoted by the same reference symbols, and description thereof is omitted.

Figure 5:
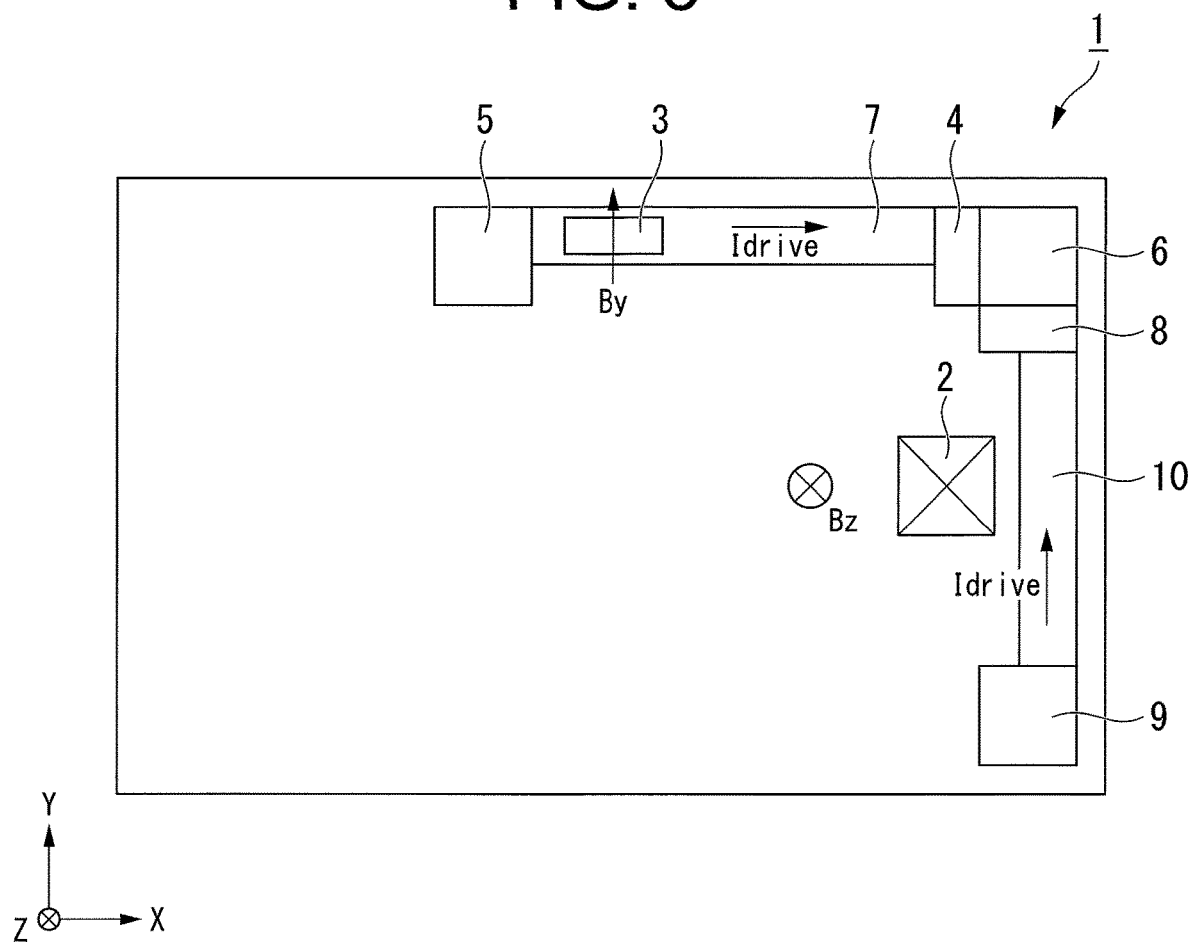
FIG. 5 is a diagram for illustrating an example of an arrangement in a magnetic sensor circuit according to a modification example of the present invention.

Application of Horizontal Magnetic Field by Horizontal Magnetic Field Application Mechanism FIG. 5 is a diagram for illustrating an example of an arrangement in the magnetic sensor circuit 1 according to the modification example.

In the modification example, a horizontal magnetic field is applied to the magnetic sensor circuit 1 by the horizontal magnetic field application mechanism configured to apply a horizontal magnetic field. The horizontal magnetic field sensor 3 detects the horizontal magnetic field applied by the horizontal magnetic field application mechanism.

The vertical magnetic field sensor 2 is arranged at a position at which the vertical magnetic field sensor 2 can detect a magnetic field generated from the second wiring 10. The magnetic field application test for the vertical magnetic field sensor 2 is performed with use of the magnetic field generated from the second wiring 10. The position at which the vertical magnetic field sensor 2 can detect the magnetic field generated from the second wiring 10 is, for example, in the vicinity of the second wiring 10. As illustrated in FIG. 5, in the modification example, the vertical magnetic field sensor 2 is arranged in the vicinity of the second wiring 10. The current that flows through the second wiring 10 when the magnetic field application test for the vertical magnetic field sensor 2 is performed with use of the magnetic field generated from the second wiring 10 is a current larger than a current that flows through the second wiring 10 when the magnetic sensor circuit 1 normally operates.

Configuration of Magnetic Sensor Circuit

In the example of the modification example, the external apparatus is connected between the third external terminal 9 and the first external terminal 6. The external apparatus is capable of changing a magnitude and a direction of the drive current that flows between the third external terminal 9 and the first external terminal 6.

As described above, the horizontal magnetic field is applied to the magnetic sensor circuit 1 by the horizontal magnetic field application mechanism. Accordingly, the horizontal magnetic field sensor 3 detects the horizontal magnetic field. The horizontal signal processing circuit 102 controls the second drive circuit 8 to the ON state in accordance with the detection of the horizontal magnetic field by the horizontal magnetic field sensor 3. As a result, the drive current flows between the third external terminal 9 and the first external terminal 6.

The vertical magnetic field sensor 2 detects the vertical magnetic field in accordance with the drive current that flows through the second wiring 10. For example, when the drive current flows in a direction from the first external terminal 6 to the third external terminal 9, the vertical magnetic field sensor 2 detects a magnetic field in the positive direction of the Z axis. For example, when the drive current flows in a direction from the third external terminal 9 to the first external terminal 6, the vertical magnetic field sensor 2 detects a magnetic field in the negative direction of the Z axis.

The vertical signal processing circuit 101 controls the first drive circuit 4 to the ON state or the OFF state in accordance with the detection of the magnetic field by the vertical magnetic field sensor 2.

Further, in the example of the modification example, the second external terminal 5 is applied with a voltage that is sufficiently higher than the potential of the first external terminal 6. The second external terminal 5 is applied with a voltage via, for example, the pull-up resistor. Further, the second external terminal 5 holds a high potential (hereinafter referred to as "high level") when the first drive circuit 4 is in the OFF state, and changes the potential to the potential of the first external terminal 6 (hereinafter referred to as "low level") when the first drive circuit 4 is in the ON state.

The magnetic sensor circuit 1 according to the modification example performs the magnetic field application test for the vertical magnetic field sensor 2 by checking the potential of the second external terminal 5.

Magnetic Conversion Characteristic of Magnetic Sensor Circuit

Figure 6:
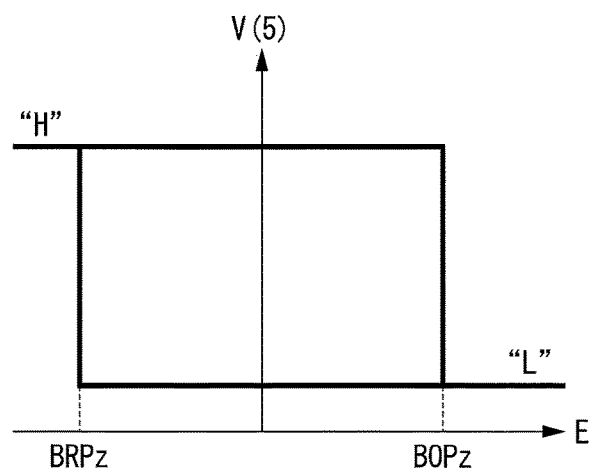
FIG. 6 is a graph for showing an example of a vertical magnetic field conversion characteristic of the magnetic sensor circuit.

FIG. 6 is a graph for showing an example of a vertical magnetic field conversion characteristic of the magnetic sensor circuit 1.

When the vertical magnetic field detected by the vertical magnetic field sensor 2 is the vertical magnetic field in the positive direction of the Z axis, and its intensity exceeds the intensity of a threshold value BOPz, the potential of the second external terminal 5 (shown V(5)) changes from the high level to the low level. Further, when the vertical magnetic field detected by the vertical magnetic field sensor 2 is the vertical magnetic field in the negative direction of the Z axis, and its intensity falls below the intensity of the threshold value BRPz, the potential of the second external terminal 5 changes to the high level.

As described above, the magnetic sensor circuit 1 performs an operation of detecting a magnetic field and converting the magnetic field into the potential of the second external terminal 5. With the configuration described above, the magnetic sensor circuit 1 can perform, for example, the alternation detection on the rotating magnetic body, for example, a ring-shaped multipolar magnet.

Operation of the magnetic sensor circuit 1 is the same as that in the first embodiment, and hence description thereof is omitted.

Summary of Modification Example

As described above, the magnetic sensor circuit 1 according to the modification example includes the vertical magnetic field sensor 2, the second external terminal 5, the first external terminal 6, the first wiring 7, the third external terminal 9, the second wiring 10, the first drive circuit 4, and the vertical signal processing circuit 101. The vertical magnetic field sensor 2 outputs a voltage in accordance with the vertical magnetic field. The vertical signal processing circuit 101 outputs a signal in accordance with the voltage output by the vertical magnetic field sensor 2. The first wiring 7 connects between the first external terminal 6 and the second external terminal 5. The second wiring 10 connects between the first external terminal 6 and the third external terminal 9. The vertical magnetic field sensor 2 is arranged at a position at which the vertical magnetic field sensor 2 can detect a magnetic field generated from the second wiring 10.

With the magnetic sensor circuit 1 according to the modification example, the vertical magnetic field sensor 2 can detect the vertical magnetic field in accordance with the drive current that flows through the second wiring 10, and thus the magnetic field application test for the vertical magnetic field sensor 2 can be performed. As a result, the magnetic sensor circuit 1 according to the modification example can perform the magnetic field application test for two axes with use of only one of two magnetic field application mechanisms (in this example, horizontal magnetic field application mechanism).

Further, in the magnetic sensor circuit 1 according to the modification example, the second wiring 10 is a wiring through which the current to be detected by the vertical magnetic field sensor 2 flows, and the vertical magnetic field sensor 2 is arranged at a position at which the vertical magnetic field sensor 2 can detect a magnetic field generated from the second wiring 10. As a result, the magnetic sensor circuit 1 according to the modification example can perform the magnetic field application test for the vertical magnetic field sensor 2 while an occupied area of the circuit is reduced as compared to the case in which a wiring for operation confirmation is used.

Further, in the magnetic sensor circuit 1 according to the modification example, the magnetic field application test for the vertical magnetic field sensor 2 is performed by causing a current larger than a current that flows through the magnetic sensor circuit 1 when the magnetic sensor circuit 1 normally operates to flow through the second wiring 10. In other words, the vertical magnetic field to be detected by the vertical magnetic field sensor 2 is a magnetic field stronger than the magnetic field generated due to the current that flows through the second wiring 10. Consequently, with the magnetic sensor circuit 1 according to the modification example, the vertical magnetic field sensor 2 can detect the vertical magnetic field without being affected by the current that flows through the second wiring 10 when the magnetic sensor circuit 1 normally operates.

Further, in the magnetic sensor circuit 1 according to the modification example, a current can flow through the second wiring 10 in both of the direction from the first external terminal 6 to the third external terminal 9 and the direction from the third external terminal 9 to the first external terminal 6. As a result, the magnetic sensor circuit 1 according to the modification example can detect two directions (positive direction and negative direction of Z axis) of the vertical magnetic field detected by the vertical magnetic field sensor 2.

In the above description, there has been described a case in which the magnetic sensor circuit 1 has a configuration in which the vertical magnetic field is applied by the vertical magnetic field application mechanism and the magnetic field application test for the horizontal magnetic field sensor 3 is performed through the internal configuration of the magnetic sensor circuit 1, or the horizontal magnetic field is applied by the horizontal magnetic field application mechanism and the magnetic field application test for the vertical magnetic field sensor 2 is performed through the internal configuration of the magnetic sensor circuit 1. However, the present invention is not limited thereto.

For example, the magnetic sensor circuit 1 may have a configuration in which the magnetic field application test for the vertical magnetic field sensor 2 can be performed through the internal configuration of the magnetic sensor circuit 1 and the magnetic field application test for the horizontal magnetic field sensor 3 can be performed through the internal configuration of the magnetic sensor circuit 1.

In this case, with the configuration described above, the vertical magnetic field sensor 2 detects the vertical magnetic field generated from the second wiring 10, and the horizontal magnetic field sensor 3 detects the horizontal magnetic field generated from the first wiring 7.

The magnetic sensor circuit 1 according to the modification example includes the vertical magnetic field sensor 2, the horizontal magnetic field sensor 3, the second external terminal 5, the first external terminal 6, the first wiring 7, the first drive circuit 4, the second drive circuit 8, the third external terminal 9, the second wiring 10, the vertical signal processing circuit 101, and the horizontal signal processing circuit 102. The vertical magnetic field sensor 2 outputs a voltage in accordance with the vertical magnetic field. The vertical signal processing circuit 101 outputs a signal in accordance with the voltage output by the vertical magnetic field sensor 2. The first wiring 7 connects between the first external terminal 6 and the second external terminal 5. The second wiring 10 connects between the first external terminal 6 and the third external terminal 9. The vertical magnetic field sensor 2 is arranged at a position at which the vertical magnetic field sensor 2 can detect a magnetic field generated from the second wiring 10. The horizontal magnetic field sensor 3 outputs a voltage in accordance with the horizontal magnetic field. The horizontal signal processing circuit 102 outputs a signal in accordance with the voltage output by the horizontal magnetic field sensor 3. The first wiring 7 connects between the first external terminal 6 and the second external terminal 5. The second wiring 10 connects between the first external terminal 6 and the third external terminal 9. The horizontal magnetic field sensor 3 is arranged at a position at which the horizontal magnetic field sensor 3 can detect a magnetic field generated from the first wiring 7.

With the magnetic sensor circuit 1 according to the modification example, the vertical magnetic field sensor 2 can detect the vertical magnetic field in accordance with the drive current that flows through the second wiring 10, and thus the magnetic field application test for the vertical magnetic field sensor 2 can be performed. Further, with the magnetic sensor circuit 1 according to the modification example, the horizontal magnetic field sensor 3 can detect the horizontal magnetic field in accordance with the drive current that flows through the first wiring 7, and thus the magnetic field application test for the horizontal magnetic field sensor 3 can be performed.

As a result, the magnetic sensor circuit 1 according to the modification example can perform the magnetic field application test for two axes without any magnetic field application mechanism. Consequently, with the magnetic sensor circuit 1 according to the modification example, a magnetic field application test for a sensor element can be simply performed.

Second Embodiment

Now, a second embodiment of the present invention is described with reference to the drawings.

In the first embodiment and the modification example thereof, there has been described a case in which the wiring for generating a magnetic field to be detected by the magnetic field sensor and the wiring through which a drive current flows in accordance with the control of the drive circuit to the ON state, which is performed by the signal processing circuit, are different from each other.

In the second embodiment, there is described a case in which the wiring for generating a magnetic field to be detected by the magnetic field sensor and the wiring through which a drive current flows in accordance with the control of the drive circuit to the ON state, which is performed by the signal processing circuit, match with each other.

The same configurations as those of the first embodiment and the modification example thereof are denoted by the same reference symbols, and description thereof is omitted.

Figure 7:
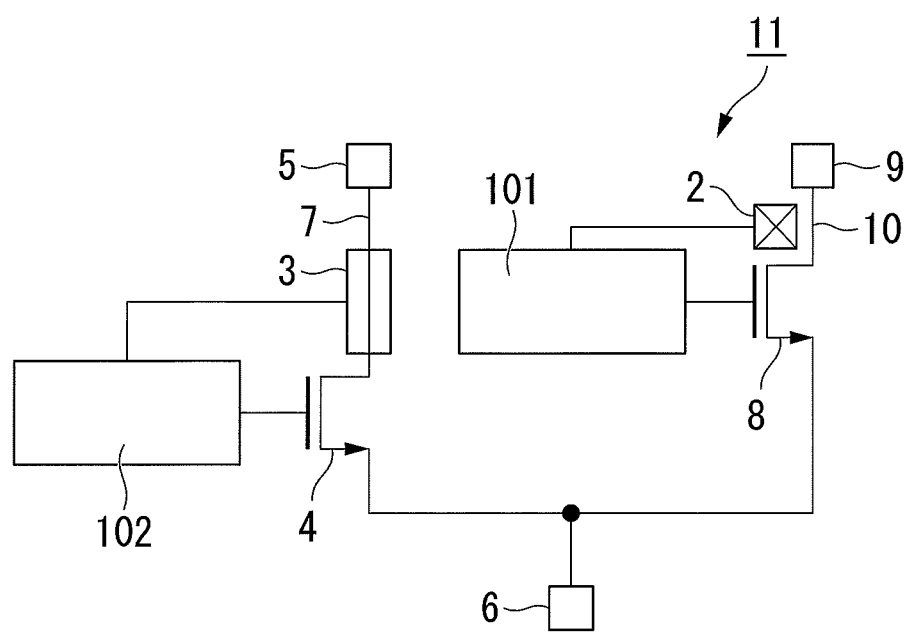
FIG. 7 is a diagram for illustrating an example of a magnetic sensor circuit according to a second embodiment of the present invention.

FIG. 7 is a diagram for illustrating an example of a magnetic sensor circuit 11 according to the second embodiment.

In the second embodiment, the horizontal magnetic field sensor 3 is arranged below the first wiring 7, and is configured to detect a horizontal magnetic field generated from the first wiring 7. The vertical magnetic field sensor 2 is arranged in the vicinity of the second wiring 10, and is configured to detect a vertical magnetic field generated from the second wiring 10.

Further, in the second embodiment, the vertical signal processing circuit 101 is configured to control the state of the second drive circuit 8 in accordance with a signal output from the vertical magnetic field sensor 2 as a result of detection of the vertical magnetic field generated from the second wiring 10. The horizontal signal processing circuit 102 is configured to control the state of the first drive circuit 4 in accordance with a signal output from the horizontal magnetic field sensor 3 as a result of detection of the horizontal magnetic field.

The vertical signal processing circuit 101 and the horizontal signal processing circuit 102 operate in their initial state, for example, from a time when the magnetic sensor circuit 11 is applied with power supply voltage to a time when a predetermined period elapses, and control the first drive circuit 4 and the second drive circuit 8 to the ON state. By causing drive currents to flow between the second external terminal 5 and the first external terminal 6 (that is, through second wiring 10) and between the third external terminal 9 and the first external terminal 6 (that is, through first wiring 7) during this period, the magnetic field application test for the vertical magnetic field sensor 2 and the magnetic field application test for the horizontal magnetic field sensor 3 can be performed.

Summary of Second Embodiment

As described above, with the magnetic sensor circuit 11 according to the second embodiment, the horizontal magnetic field sensor 3 can detect the horizontal magnetic field in accordance with the drive current that flows through the first wiring 7, and thus the magnetic field application test for the horizontal magnetic field sensor 3 can be performed. Further, with the magnetic sensor circuit 11 according to the second embodiment, the vertical magnetic field sensor 2 can detect the vertical magnetic field in accordance with the drive current that flows through the second wiring 10, and thus the magnetic field application test for the vertical magnetic field sensor 2 can be performed.

As a result, the magnetic sensor circuit 11 according to the second embodiment can perform the magnetic field application test for two axes without any magnetic field application mechanism. Consequently, with the magnetic sensor circuit 11 according to the second embodiment, a magnetic field application test for a sensor element can be simply performed.

The horizontal magnetic field sensor 3 may be arranged below the second wiring 10 instead of below the first wiring 7. Further, the vertical magnetic field sensor 2 may be arranged in the vicinity of the first wiring 7 instead of in the vicinity of the second wiring 10.

In the first and second embodiments and the modification example of the first embodiment, there has been described a case in which the magnetic sensor circuit (in examples described above, magnetic sensor circuit 1 and magnetic sensor circuit 11) includes the vertical magnetic field sensor 2 and the horizontal magnetic field sensor 3. However, the present invention is not limited thereto.

For example, the magnetic sensor circuit may include any one of the vertical magnetic field sensor 2 and the horizontal magnetic field sensor 3.

For example, similarly to the configuration described in the second embodiment, the magnetic sensor circuit may have a configuration in which the wiring for generating a magnetic field to be detected by the magnetic field sensor and the wiring through which a drive current flows in accordance with the control of the drive circuit to the ON state, which is performed by the signal processing circuit, match with each other. In this case, the magnetic sensor circuit may include the vertical magnetic field sensor 2, the first external terminal 6, the second drive circuit 8, the third external terminal 9, the second wiring 10, and the vertical signal processing circuit 101. Alternatively, the magnetic sensor circuit may include the horizontal magnetic field sensor 3, the first drive circuit 4, the second external terminal 5, the first external terminal 6, the first wire 7, and the horizontal signal processing circuit 102.

As a result, the magnetic sensor circuit can perform the magnetic field application test for one axis without any magnetic field application mechanism. Consequently, with such a magnetic sensor circuit, a magnetic field application test for a sensor element can be simply performed.

Although the embodiments of the present invention have been described in detail with reference to the drawings, the specific configurations are not limited to those of the embodiments, and the present invention can be appropriately changed without departing from the gist of the present invention. The configurations described in each of the above-mentioned embodiments may be combined with each other.

What is claimed is:

1. A magnetic sensor circuit, comprising:
   one of a first magnetic sensor element configured to output a voltage in accordance with a vertical magnetic field and a second magnetic sensor element configured to output a voltage in accordance with a horizontal magnetic field;
   a magnetic field signal processing circuit configured to output a signal in accordance with the voltage;
   at least three terminals configured to be connected to an external element, the at least three terminals being a first terminal, a second terminal, and a third terminal;
   a first wiring connecting the first terminal and the second terminal; and
   a second wiring connecting the first terminal and the third terminal,
   one of the first magnetic sensor element and the second magnetic sensor element being arranged at a position where detection of a magnetic field generated by one of the first wiring and the second wiring is possible.

2. The magnetic sensor circuit according to claim 1:
   wherein the first wiring is a wiring through which a current which generates a detection target of the second magnetic sensor element flows;
   wherein the second wiring is a wiring through which a current which generates a detection target of the first magnetic sensor element flows;
   wherein the first magnetic sensor element is arranged at the position at which the first magnetic sensor element is configured to detect the magnetic field generated by the second wiring; and
   wherein the second magnetic sensor element is arranged at the position at which the second magnetic sensor element can detect the magnetic field generated by the first wiring.

3. The magnetic sensor circuit according to claim 1:
   wherein the first wiring permits a current flow therethrough in both of a direction from the first terminal to the second terminal and a direction from the second terminal to the first terminal; and
   wherein the second wiring permits a current flow therethrough in both of a direction from the first terminal to the third terminal and a direction from the third terminal to the first terminal.

4. The magnetic sensor circuit according to claim 1:
wherein the second magnetic sensor element is selected from the first magnetic sensor element and the second magnetic sensor element; and
wherein the second magnetic sensor element is arranged at one of a position below the first wiring and a position below the second wiring.

5. A test method for the magnetic sensor circuit of claim 1, comprising:
performing a magnetic field application test for one of the first magnetic sensor element and the second magnetic sensor element by applying a current which is larger than a current that flows through the magnetic sensor circuit under normal operation to flow through one of the first wiring and the second wiring.

6. A manufacturing method for a semiconductor device having a magnetic sensor circuit, comprising:
forming the magnetic sensor circuit of claim 1; and
performing a test to the magnetic sensor circuit using the test method of claim 5.

7. A magnetic sensor circuit, comprising:
a magnetic sensor element configured to output a voltage in accordance with a magnetic field;
a magnetic field signal processing circuit configured to output a signal in accordance with the voltage;
at least two terminals configured to be connected to an external element, the at least two terminals being a first terminal and a second terminal; and
a wiring connecting the first terminal and the second terminal, and through which a current larger than a current that flows through the magnetic sensor circuit under normal operation is applied,
the magnetic sensor element being arranged at a position where detection of a magnetic field generated by the wiring is possible.

* * * * *